United States Patent
Bräunlich et al.

(10) Patent No.: US 6,356,454 B1
(45) Date of Patent: Mar. 12, 2002

(54) ELECTRICAL UNIT HAVING AN ALIGNING ELEMENT

(75) Inventors: Michael Bräunlich; Frank Fügmann, both of Chemnitz (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/508,606
(22) PCT Filed: Sep. 2, 1998
(86) PCT No.: PCT/DE98/02582
§ 371 Date: May 25, 2000
§ 102(e) Date: May 25, 2000
(87) PCT Pub. No.: WO99/14995
PCT Pub. Date: Mar. 25, 1999

(30) Foreign Application Priority Data

Sep. 15, 1997 (DE) .......................................... 197 40 566

(51) Int. Cl.⁷ ................................................. H05K 1/14
(52) U.S. Cl. ........................ 361/784; 361/760; 361/802; 361/720; 361/714
(58) Field of Search ................................. 361/784, 730, 361/733, 748, 749, 684, 760, 800, 801, 825, 752, 796, 785, 759

(56) References Cited

U.S. PATENT DOCUMENTS

| 3,829,741 | A | * | 8/1974 | Athey ........................ 317/101 |
| 4,838,798 | A | * | 6/1989 | Evans et al. ................... 439/61 |
| 4,964,017 | A | * | 10/1990 | Jindrick et al. .............. 361/390 |
| 5,347,430 | A | * | 9/1994 | Curlee et al. ................ 361/816 |
| 5,402,320 | A | * | 3/1995 | Kielstra et al. .............. 361/802 |
| 5,429,521 | A | * | 7/1995 | Morlion et al. ............. 439/108 |
| 5,458,497 | A | * | 10/1995 | Yasumura et al. ............. 439/62 |
| 5,535,100 | A | * | 7/1996 | Lubahn et al. .............. 361/801 |
| 5,801,925 | A | * | 9/1998 | Boada Fonts ............... 361/752 |
| 5,906,501 | A | * | 5/1999 | Longgueville et al. ....... 439/327 |
| 6,033,234 | A | * | 3/2000 | Wang et al. ................... 439/67 |
| 6,094,358 | A | * | 7/2000 | Christensen et al. ........ 361/785 |

FOREIGN PATENT DOCUMENTS

| DE | 1 867 945 | 2/1963 |
| FR | 2 567 304 | 1/1986 |

* cited by examiner

Primary Examiner—Jeffrey Gaffin
Assistant Examiner—Hung Bui
(74) Attorney, Agent, or Firm—Staas & Halsey LLP

(57) ABSTRACT

An electrical unit is described which has a housing or housing part and a fist printed circuit board and a second printed circuit board which can be placed in contact with one another so as to be electrically conductive. The housing or housing part includes at least one aligning element suitable for guiding and fixing both the first printed circuit board and the second printed circuit board. The first printed circuit board has a cutout which is matched to the cross section of the aligning element and through which the aligning element protrudes when the first printed circuit board has been fixed. The free end of the aligning element has a contour which acts to guide the second printed circuit board when contact is made with the latter.

5 Claims, 2 Drawing Sheets

ELECTRICAL UNIT HAVING AN ALIGNING ELEMENT

FIELD OF THE INVENTION

The present invention relates to an electrical unit having a housing or housing part and a first and a second printed circuit board which can be placed in contact with one another so as to be electrically conductive, and to a housing or housing part for an electrical unit, provided for accommodating a first printed circuit board and a second printed circuit board which can be placed in contact with the latter.

BACKGROUND OF THE INVENTION

To connect components of electrical and/or electronic assemblies, e.g., the aforementioned two printed circuit boards, which are to be handled by the user, plug connectors with increasingly smaller contact spacings are used. This results both from the constant miniaturization of such assemblies and from modern production technology (use of SMT components).

This necessitates finer and more precise mechanical guidance of the components (on the aforementioned printed circuit boards) with respect to one another so that the plug connectors are not damaged when the assembly components are moved or so that the plugging procedure is made less complicated for the user and demands less sensitivity from him.

If the assembly components i.e.,—the printed circuit boards or the components of the electrical unit with the printed circuit boards it contains—are not plugged in only linearly, and hence in the plug connector's direction of actuation, but are pivoted, this problem area becomes more intense.

Conventionally to mount the printed circuit boards in the components which hold the plug connectors which are to be connected, narrow tolerances are used so that their guidance is thus ensured. The components' housings in turn have a guidance imparted relative to one another which is also provided with narrow tolerances. This ensures that, when the assembly components are plugged together, the plug connectors are brought into a position relative to one another which results in reliable plugging, and hence causes the contacts to be guided relative to one another without the possibility of any external influence.

In this case, the simultaneous action of various measures causes the resultant overall tolerances to become very large in comparison to the play of the plug connector used. This means that, on the one hand, complex measures are necessary to restrict the individual tolerances, particularly for the housing parts, and, on the other hand, the plug connectors used for this application need to have a certain "coarseness".

SUMMARY

Accordingly, an object of the present invention is to provide an electrical unit or a housing or housing part in which the mechanical guidance of the components relative to one another is shifted from the plane of the housing to the plane of the printed circuit board.

This object is achieved by providing a housing or housing part which at least one aligning element suitable for guiding and fixing both a first and a second printed circuit board, in that the first printed circuit board with a cutout which is matched to the cross section of the aligning element and through which the aligning element protrudes when the first printed circuit board has been fixed, and a free end of the aligning element with a contour which acts to guide the second printed circuit board when contact is made with the latter.

Similarly, the aforementioned object is achieved by providing a housing or housing part with at least one aligning element suitable for guiding and fixing both the first and the second printed circuit board, the aligning element engaging in a cutout, which is matched to the cross section of the aligning element, in the first printed circuit board in order to guide and fix the first printed circuit board, and a free end of the aligning element with a contour which acts to guide the second printed circuit board when contact is made with the latter.

The contour, above-described, of the free end of the aligning element can, for example, be a slot-shaped contour, with the slot being oriented parallel to a plane defined by the plug connector on the first printed circuit board, so that the second printed circuit board can be aligned by this contour of the aligning element at least in relation to one direction of movement.

If the second printed circuit board has a guide contour which engages with the contour of the aligning element when contact is made between the second printed circuit board and the first printed circuit board, the second printed circuit board is guided exactly in two directions of movement when contact is made with the first printed circuit board. This means that, when contact is made with the first printed circuit board, the second printed circuit board is guided by the aligning element in the two directions of movement perpendicular to the plug connector's direction of actuation.

If the aligning element is integrally formed on the housing or housing part, the fact that the aligning element is undetachably connected to the housing means that the components can be guided particularly exactly.

If the aligning element is tapered toward the free end, alignment of the first printed circuit board by means of the cutout, which is matched to the cross section of the aligning element, in this printed circuit board is simplified.

DETAILED DESCRIPTION

Figure 1:
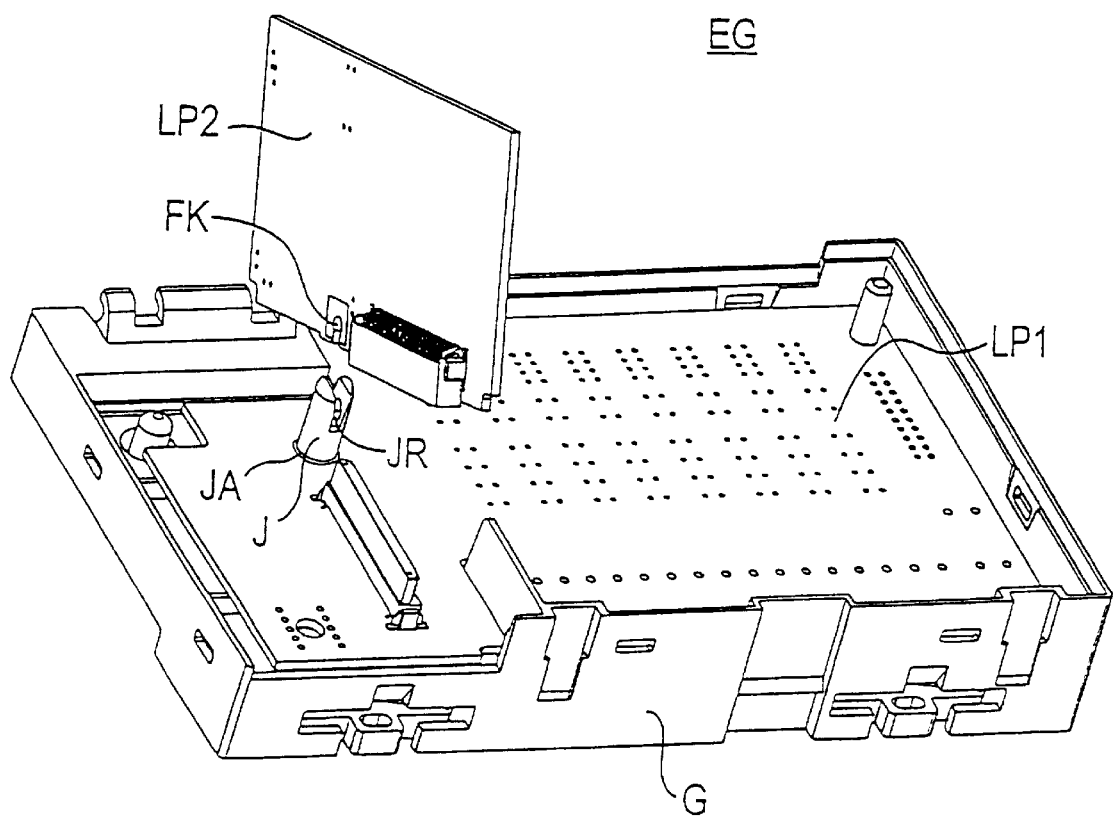
FIG. 1 shows an electrical unit and a housing or housing part having an aligning element.

As shown in FIG. 1, the electrical unit EG has a housing or housing part G. The housing or housing part G holds a first printed circuit board LP1. This printed circuit board LP1 is fixed by means of the aligning element J of the housing G, as a result of the aligning element J engaging through a cutout JA which is matched to the cross section of the aligning element J.

If, as in the case of the illustrative embodiment shown in FIG. 1, the aligning element J is tapered toward the free end, the aligning element J engages in the cutout JA in a form-fitting manner when the printed circuit board LP1 has been fixed, so that the printed circuit board LP1 is fixed in the two directions of movement perpendicular to the axis of the aligning element.

The first printed circuit board LP1 has a contact element for making electrically conductive contact between the first printed circuit board LP1 and a second printed circuit board LP2, which also has a contact element for this purpose. In the illustrative embodiment, the two contact elements are designed as a plug connector and a corresponding mating plug connector.

For guiding the second printed circuit board LP2, the aligning element J has a contour JR which acts to guide the second printed circuit board LP2 when contact is made between the second printed circuit board LP2 and the first printed circuit board LP1. In the simplest case, this contour JR is a slot-like contour JR, the slot JR being oriented parallel to the plane defined by the plug connector arranged on the first printed circuit board LP1.

In the illustrative embodiment, the slot-like contour JR has a web provided in it which also allows the second printed circuit board LP2 to be guided in the direction of movement parallel to the plane defined by the plug connector on the first printed circuit board LP1 when contact is made. For this purpose, the second printed circuit board LP2 has a guide contour FK which engages with the contour JK of the aligning element J, the slot-like contour JR of the aligning element J being matched to the thickness of the printed circuit board LP2 itself, and the guide contour FK being essentially matched to the web in the contour JR of the aligning element J.

In this case, the guide contour FK in the second printed circuit board LP2 is of slot-like design directly at the edge of the printed circuit board LP2, becomes wider at a certain distance from the edge of the printed circuit board LP2 and, at this point, has, by way of example, a circular or oval contour, or at least opens wider than the slot directly at the edge of the printed circuit board.

When contact is made between the second printed circuit board LP2 and the first printed circuit board LP1, the second printed circuit board LP2 is first guided by the slot-like contour JR of the aligning element J in the direction of movement parallel to the plane of the plug connector on the first printed circuit board LP1.

If, when contact is made between the second printed circuit board LP2 and the first printed circuit board LP1, the second printed circuit board LP2 moves further in the direction of actuation of the plug connector, the web within the slot-like contour JR of the aligning element J engages with the corresponding cutout FK in the second printed circuit board LP2, so that, when contact is made, the second printed circuit board LP2 is now additionally also fixed in the direction of movement parallel to the plane defined by the plane of the plug connector on the first printed circuit board LP1.

As the printed circuit board LP2 is moved further in the direction of actuation of the plug connector, the plug connectors themselves finally engage with one another. Since the second printed circuit board LP2 cannot be guided more precisely than by the plug connectors themselves, the guide contour FK in the second printed circuit board LP2 is, as already described, widened above the initially slot-like contour FK, so that the form-fit initially existing with the web JR in the aligning element J is released.

Accordingly, the initially rigid guidance of the printed circuit board LP2 by the aligning element J, or by the interaction of the contour of the aligning element JR and the guide contour FK in the second printed circuit board LP2, is released as soon as the plug connectors themselves engage, and hence defined, reliable guidance is ensured.

The aligning element J, or its contour JR and the corresponding guide contour FK in the second printed circuit board LP2, is designed such that contact can be made between the second printed circuit board LP2 and the first printed circuit board LP1 either with a linear movement, that is to say with a plugging action, or with an at least partially rotary movement, that is to say with a pivoting action.

If contact is made between the first printed circuit board LP1 and a plurality of printed circuit boards LP2, each of these second printed circuit boards LP2 can have an aligning element J provided for it which has an appropriate contour JR and engages with a corresponding guide contour FK in the respective second printed circuit board LP2.

Figure 2:
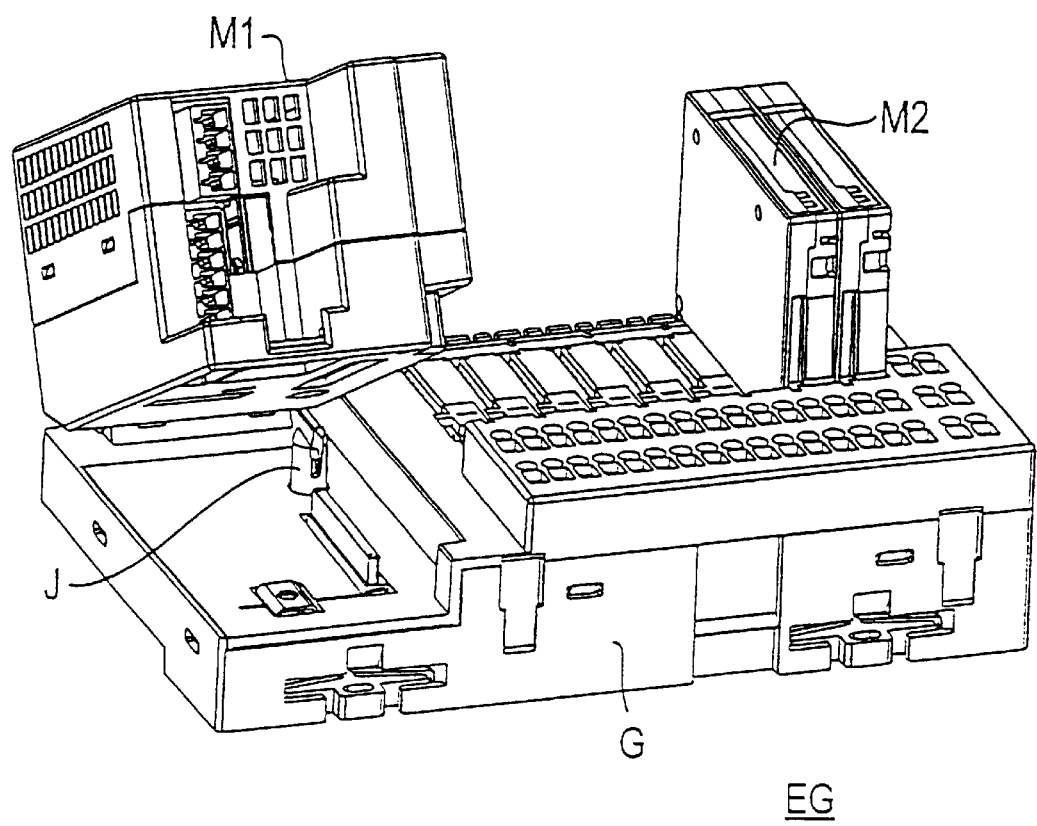
FIG. 2 shows the housing or housing part closed.

If, as shown in FIG. 2, the housing or housing part G is closed, only the plug connectors and the aligning element J now protrude through appropriate cutouts in the housing elements, so that they act to make contact with or to guide printed circuit boards provided in modules M1, M2.

What is claimed is:

1. An electrical unit, comprising:

a housing including an aligning element, the aligning element having leg portion and a web at least partially recessed within the leg portions;

a first printed circuit board having a cutout matching a cross section of the aligning element, the aligning element protruding through the cutout when the first printed circuit board is fixed; and a second printed circuit board having top and bottom opposing sides that fit within the legs of the aligning element such that the legs of the aligning element guide the second printed circuit board into electrical contact with the first circuit board, the second circuit board further having a slot extending between the top and bottom sides, from an edge of the second printed circuit board, the slot receiving the web of the aligning element.

2. The electrical unit according to claim 1, wherein the legs of the aligning element have tapered end portions that extend generally parallel with top and bottom sides of the second printed circuit board when the second printed circuit board is guided into electrical contact with the first printed circuit board.

3. The electrical unit according to claim 1, wherein the web of the aligning element extends substantially perpendicular to the legs of the aligning element, and the slot in the second circuit board extends generally perpendicular to the front and back sides of the second circuit board.

4. The electrical unit according to claim 1, wherein the slot in the second printed circuit board has a width, and the width of the slot in the second printed board increases at a predetermined distance from the edge of the second printed circuit board.

5. The electrical unit according to claim 4, wherein the web of the aligning element has a width, and the width of the slot in the second printed circuit board substantially corresponds with the width of the web of the aligning element, at the edge of the second circuit board.

* * * * *